(12) United States Patent
Pahl

(10) Patent No.: US 8,531,018 B2
(45) Date of Patent: Sep. 10, 2013

(54) COMPONENT COMPRISING A CHIP IN A CAVITY AND A STRESS-REDUCED ATTACHMENT

(75) Inventor: Wolfgang Pahl, Munich (DE)

(73) Assignee: Epcos AG, Munich (DE)

( * ) Notice: Subject to any disclaimer, the term of this patent is extended or adjusted under 35 U.S.C. 154(b) by 252 days.

(21) Appl. No.: 13/050,260

(22) Filed: Mar. 17, 2011

(65) Prior Publication Data

US 2011/0230068 A1 Sep. 22, 2011

(30) Foreign Application Priority Data

Mar. 19, 2010 (DE) .......................... 10 2010 012 042

(51) Int. Cl.
*H01L 23/02* (2006.01)
*H01L 23/48* (2006.01)
*H01L 23/52* (2006.01)

(52) U.S. Cl.
USPC ........... 257/678; 257/680; 257/688; 257/690; 257/692; 257/E23.116

(58) Field of Classification Search
None
See application file for complete search history.

(56) References Cited

U.S. PATENT DOCUMENTS

| | | | |
|---|---|---|---|
| 6,482,013 B2 | 11/2002 | Eldridge et al. | |
| 7,225,678 B2 | 6/2007 | Kandler et al. | |
| 2004/0102064 A1* | 5/2004 | Mathieu | 439/66 |
| 2006/0180927 A1* | 8/2006 | Takai et al. | 257/734 |
| 2007/0069354 A1 | 3/2007 | Dangelmaier et al. | |
| 2009/0127697 A1* | 5/2009 | Pahl | 257/698 |

FOREIGN PATENT DOCUMENTS

| DE | 4306268 A1 | 9/1994 |
|---|---|---|
| DE | 102004044982 A1 | 4/2006 |

* cited by examiner

*Primary Examiner* — Julio J Maldonado
*Assistant Examiner* — Harpreet Singh
(74) *Attorney, Agent, or Firm* — Nixon Peabody LLP

(57) ABSTRACT

A mechanically improved component comprising a chip in a cavity and a stress-reduced attachment is specified. A component comprises an opening in a housing, an opaque cover or a mechanically flexible line connector, which is attached to two locations.

23 Claims, 5 Drawing Sheets

COMPONENT COMPRISING A CHIP IN A CAVITY AND A STRESS-REDUCED ATTACHMENT

CROSS-REFERENCE TO RELATED APPLICATION

This application claims the benefit under 35 U.S.C. §119 of Germany Patent Application Serial No. 10 2010 012 042.1, filed in Germany on Mar. 19, 2010, entitled "Component Comprising a Chip in a Cavity and a Stress-Reduced Attachment."

COPYRIGHT

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE DISCLOSURE

The invention relates to components comprising a chip which is arranged in a cavity and is attached in a stress-reduced manner.

BACKGROUND

Electrical components, in particular those which are intended to be used in portable devices, are intended to be able to be produced as robustly as possible, with the smallest possible construction and as cost-effectively as possible.

The document US 2009/0127697 A1 discloses an electrical component in a housing.

One object of the present invention is to specify components comprising a chip which is arranged in a cavity and is attached in a stress-reduced manner, and which has improvements by comparison with known components. In particular, an improved chip is intended to cover a larger field of application or the chip arranged in the cavity is intended to be better protected against external mechanical effects.

These objects are achieved by the components in accordance with the independent claims. The dependent claims specify further and advantageous configurations.

SUMMARY

In one variant, the component comprises a chip having an electrical terminal, a housing having a cavity, and a mechanically flexible line connector. The chip is arranged in the cavity of the housing. The housing furthermore comprises an electrical line. The mechanically flexible line connector interconnects the electrical terminal of the chip with the electrical line. The mechanically flexible line connector has a lower stiffness than the chip and is mechanically deformable. The chip is substantially fixed by the flexible line connector. The housing of the component has an opening, through which the cavity is in contact with the atmosphere surrounding the component. The chip is a sensor.

In this case, the chip can be fixed exclusively by the flexible line connector. The flexible line connector can have a higher stiffness than a conventional bonding wire.

The document cited above discloses a component comprising a chip in a cavity. The chip is connected to electrical contacts of the housing by a mechanically flexible line connector. The component of the present invention is improved by comparison with components known from the prior art to the effect that the component can be used as a sensor on account of the opening in the housing, wherein the sensor, via the housing opening, is in contact with the atmosphere surrounding the component and can detect corresponding parameters such as e.g. temperature, pressure, air humidity, sound pressure, gas composition or the like.

In different embodiments, the chip is a pressure sensor, a sound sensor, an optical sensor or a sensor for detecting a gas composition.

In one embodiment, the diameter of the opening is less than 100 µm. It is also possible for the diameter of the opening to be substantially 100 µm.

In one alternative variant, the component comprises a chip having an electrical terminal. The component furthermore comprises a housing having a cavity, an electrical line and a cover. The chip is arranged in the cavity and the cover covers the cavity. The component furthermore comprises a mechanically flexible line connector, which interconnects the electrical terminal of the chip with the electrical line. The mechanically flexible line connector has a lower stiffness than the chip and is mechanically deformable. The cover of the housing comprises a light-transparent polymer layer having an optical absorptance of greater than 95% in the wavelength range of between 400 nm and 1100 nm.

The polymer layer can be weakly light-transmissive. The optical absorptance of the layer is preferably less than 99% in the specified wavelength range. The absorptance lies between 95% and 99%, for example.

Such a component whose cover has a high optical absorptance in the visible wavelength range is suitable for accommodating light-sensitive chips. In particular chips comprising a semiconducting material can benefit from reduced incidence of light. On account of the width of the energy gap of semiconducting material, such chips can react to incidence of light with disturbances.

Alternatively, it is also possible to use a semiconductor chip or some other chip which reacts to optical stimuli, e.g. if the cover has a defined light incidence opening.

In a third variant, the component comprises a chip having an electrical terminal, and a housing. The housing furthermore comprises a cavity, in which the chip is arranged, and an electrical line. The component furthermore has a mechanically flexible line connector, which interconnects the electrical terminal of the chip with the electrical line. The mechanically flexible line connector has a lower stiffness than the chip and is mechanically deformable. The line connector may have a first bearing element, at which the electrical terminal of the chip is connected to the line connector. The line connector comprises at least a first connecting web and at least a second connecting web, wherein the first bearing element is coupled to the at least one first connecting web and the at least one second connecting web. The at least one first connecting web and the at least one second connecting web connect the first bearing element with the electrical line. The at least one first connecting web and the at least one second connecting web are arranged spaced apart from each other between the first bearing element and the electrical line.

According to a further embodiment the line connector is attached to the inner side of the cavity at two locations spaced apart from one another. In this case, the number of mechanical fixtures can be different—e.g. depending on the variant chosen.

The first bearing element may be arranged at a clear distance above a surface, for example a bottom surface, in the hollow body of the housing. The line connector can have a second bearing element, which is arranged in a manner spaced apart from the first bearing element and which is arranged on a surface, in particular on the bottom surface, in the cavity of the housing. The first and the second bearing element are connected by means of one of the connecting webs. The first and the second bearing element can be arranged at opposite end sections of the connecting web.

The bearing elements and the connecting web can be embodied in parallelepipedal or cylindrical fashion. Between the first and second bearing elements, the connecting web of the line connector preferably runs non-linearly and is curved and/or angled and/or provided with slots. The connecting web and the bearing elements can be arranged perpendicularly to one another. The connecting web can run for example largely parallel to the bottom surface in the interior of the hollow body of the housing.

The electrical terminals of the chip are connected to the first bearing element of the line connector. The chip can be connected for example on its underside to the first bearing element of the line connector. If appropriate, the connection is additionally supported by a bonding means arranged therebetween, such as, for example, a solder bump (e.g. solders comprising Sn, Pb, Ag or Au), stud bump (e.g. Au), solder tin or the like.

The chip can be held at a plurality of line connectors, for example, which can be arranged contactlessly among one another. Each of the line connectors can have a first bearing element, at which the chip is held at the line connector. The line connectors can in each case additionally have at least two further second and third bearing elements spaced apart from one another, at which the line connector is attached to the bottom surface in the cavity of the housing. Consequently, each line connector is connected, at one bearing surface, to the chip and, at two bearing surfaces of the line connector that are spaced apart from one another, to the housing body and respectively to an electrical line on the bottom surface in the hollow body of the housing.

By virtue of the fact that the flexible line connector is attached to the inner side of the cavity at two locations spaced apart from one another, its mechanical stability is improved without mechanical stresses jeopardizing the chip. In particular, a mechanically flexible line connector withstands torsional forces better, without relinquishing its flexibility with regard to bending.

According to another embodiment the mechanically flexible line connector comprises a first chip-supporting bearing element and a fixed second bearing element which is fixed on a bottom surface of the housing in the cavity of the housing. At least two connecting webs are arranged between the first bearing element and the second bearing element. The junctions of the connecting webs on one bearing element or on every of the bearing elements can be spaced apart from each other.

The mechanically flexible line connector fulfils two tasks in all the variants: firstly, it serves for electrically interconnecting the chip with the electrical line of the component. Secondly, it serves as mechanical attachment of the chip in the cavity of the housing. The low stiffness of the flexible line connector reduces mechanical stresses between the chip and the housing. In particular mechanical stresses which occur on account of different coefficients of thermal expansion can thus easily be reduced. Use in mobile devices often requires an increased mechanical stability and robustness of the components used. Mobile devices are particularly at risk in respect of falling over or getting trapped.

Since the flexible line connector serves not only as mechanical attachment but also as interconnecting element, the fail-safeness is increased if the flexible line connector should break at one location. The redundancy owing to the second attachment location, which can also be an electrical contact-making location, thus increases the fail-safeness.

The chip and the line connector can be arranged in such a way that all the side surfaces of the chip arranged on the first bearing element of the line connector are arranged in a manner spaced apart from the housing body. The side surfaces of the chip can be spaced apart from the side surfaces of the housing by an air gap, for example. The interior of the cavity of the housing can be embodied in a manner free of filling compound.

In one embodiment of the abovementioned components, the inner side of the cavity, the surfaces of the chip or of the line connector are covered with a polymer film having a thickness of less than or equal to 10 µm. It is possible, in particular, for the inner side of the cavity, the surfaces of the chip and of the line connector to be covered with a polymer film. A thin polymer film acts as a passivation layer and can protect surfaces arranged in the interior of the cavity against corrosion or contamination by substances situated in the surrounding atmosphere. This is relevant in so far as the cavity in the component can be connected to the surrounding atmosphere via an opening in the housing. The polymer film can comprise parylenes.

In one embodiment, the housing comprises a ceramic, e.g. an HTCC (High Temperature Cofired Ceramics) or an LTCC (Low Temperature Cofired Ceramics).

In one configuration of this embodiment, the housing comprises multilayered HTCC or multilayered LTCC. Metallization planes are arranged between dielectric layers of the HTCC or LTCC. The metallization planes overlap the base area of the cavity in total to the extent of at least 80% of the base area of the cavity. Metals have a high absorptance in the visible optical wavelength range. Even if the ceramic material, e.g. on account of the walls being made very thin, is highly transparent, good optical screening or good RF (radio frequency) screening is still afforded.

The cavity can be covered with an additional metallization layer on the inside.

In addition, passive circuit components such as capacitive elements, inductive elements or resistive elements can be integrated as patterned metallizations in the metallization planes.

In one embodiment, the chip is operated at an electrical, mechanical or acoustic operating frequency. The chip can be operated e.g. at a mechanical operating frequency and be a rate-of-rotation sensor. The chip and the one or the plurality of mechanical flexible line connectors necessarily form a mechanical oscillator; on account of the mechanically flexible attachment of the chip, the chip can oscillate as if it were suspended on a spring. In this case, the natural frequency of the mechanical oscillator consisting of the chip and the mechanically flexible line connectors is less than 0.8 times the operating frequency of the chip. If the chip is an MEMS (microelectromechanical system) chip and comprises component structures that oscillate or can be excited to effect oscillations, then provision is made for choosing the natural frequencies of the systems chip with line connector, on the one hand, and the component structures, on the other hand, such that the coupling of the oscillation modes of these oscillations is minimized.

In one embodiment, a further chip and a further electrical line are additionally arranged in the cavity. The further chip is interconnected with the electrical line or the further electrical line.

It may be preferred for more than one chip to be arranged in the cavity. Particularly if the component is intended to function as a sensor, it is advantageous additionally to arrange an ASIC chip (ASIC=Application Specific Integrated Circuit) alongside an MEMS chip having electromechanical component structures. Both chips, e.g. the MEMS chip and the ASIC chip, can then be interconnected with one another.

In one embodiment, an ASIC chip or an MEMS chip is interconnected as the chip.

A method for producing a component according to the invention comprises the following steps:
  providing a first housing part having a concave section and an electrical line, a chip having an electrical terminal and a cover,
  forming a mechanically flexible line connector, which is interconnected with the electrical line of the first housing part, in the concave section,
  arranging the chip in the concave section,
  connecting and interconnecting the electrical terminal of the chip to and with the line connector,
  producing and at least partly closing off a cavity by arranging the cover above the concave section.

In one embodiment of the production method, a patterned sacrificial layer is produced before the process of forming the line connector in the concave section. A section of the line connector is formed on the sacrificial layer. The sacrificial layer is removed before the line connector is connected to and interconnected with an electrical terminal of the chip.

Conventional methods for producing components comprising flexible line connectors provide for patterning the flexible line connector on a sacrificial layer and firstly interconnecting the electrical line connector with the chip. Only then is the sacrificial layer removed. The advantage of this order is that the sacrificial layer can build up a mechanical counterpressure if the chip is pressed onto the flexible line connector for contact-making purposes.

However, the invention now provides for firstly removing the sacrificial layer and then arranging the chip in the cavity and interconnecting it. The absence of the sacrificial layer is accepted in this case. What is advantageous about the method according to the invention in this case is that the chip is not contaminated with chemicals or substances used during the removal of the sacrificial layer, for example by etching.

In one embodiment, the sacrificial layer is patterned by means of a resist layer, wherein the resist layer comprises a film.

In one embodiment, the surfaces of the concave section, of the line connector, of the chip and at least one part of the cover are covered with a polymer film.

The invention is explained in greater detail below on the basis of exemplary embodiments and schematic figures.

DETAILED DESCRIPTION

Figure 1:
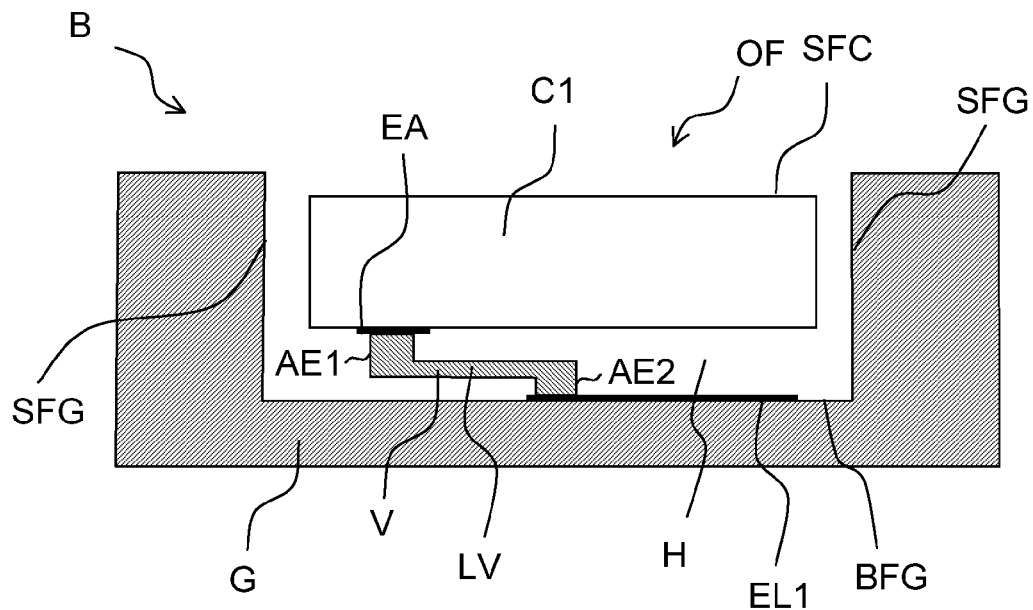
FIG. 1 shows a component comprising a chip in a concave section of a housing.

FIG. 1 shows a component B comprising a housing G. An electrical line EL1 is arranged on the underside of the housing G. A chip C1 is arranged in the cavity H of the housing G. The chip has a plurality of side surfaces SFC. The chip C1 comprises an electrical terminal EA at its underside. The electrical terminal EA of the chip C1 is interconnected with the electrical line EL1 by means of a mechanically flexible line connector LV. At the same time, the mechanically flexible line connector serves as a mechanical receptacle of the chip C1 in the housing G.

The housing can be formed integrally from a material into which a depression is introduced, said depression forming the cavity H. The housing body has side surfaces SFG and a bottom surface BFG in the interior of the cavity. The electrical line EL1 is arranged on the bottom surface BFG of the housing. The cavity of the housing is embodied as a parallelepipedal depression, in which the chip C1 is arranged; the upwardly directed opening of the depression constitutes the opening OF of the component B. The chip is accommodated in the cavity of the housing in such a way that its side surfaces SFC are arranged in a manner spaced apart from the housing body. In particular, the side surfaces of the chip and of the housing body can be spaced apart from one another by an air gap.

The mechanically flexible line connector LV can have a first bearing element AE1, which is arranged at a clear distance above the bottom surface BFG of the housing body. The line connector LV can have a second bearing element AE2, which is arranged in a manner spaced apart from the first bearing element and which is arranged on the bottom surface BFG in the cavity of the housing. The first and the second bearing element AE1, AE2 are connected by means of a connecting web V. The first and the second bearing element can be arranged at opposite end sections of the connecting web.

The line connector is deformable in such a way that the first bearing element AE1 touches the bottom surface BF of the housing body in the event of a force action on the chip C1. If there is no force action on the chip, the bearing element AE1 is arranged at a distance above the bottom surface BFG. The bearing element AE1 therefore forms a free end section of the line connector which is arranged resiliently at a distance above the bottom surface BFG of the housing body. The bearing element AE2 forms an end section of the line connector at which the line connector is firmly fixed to the bottom surface BF of the housing.

Figure 2:
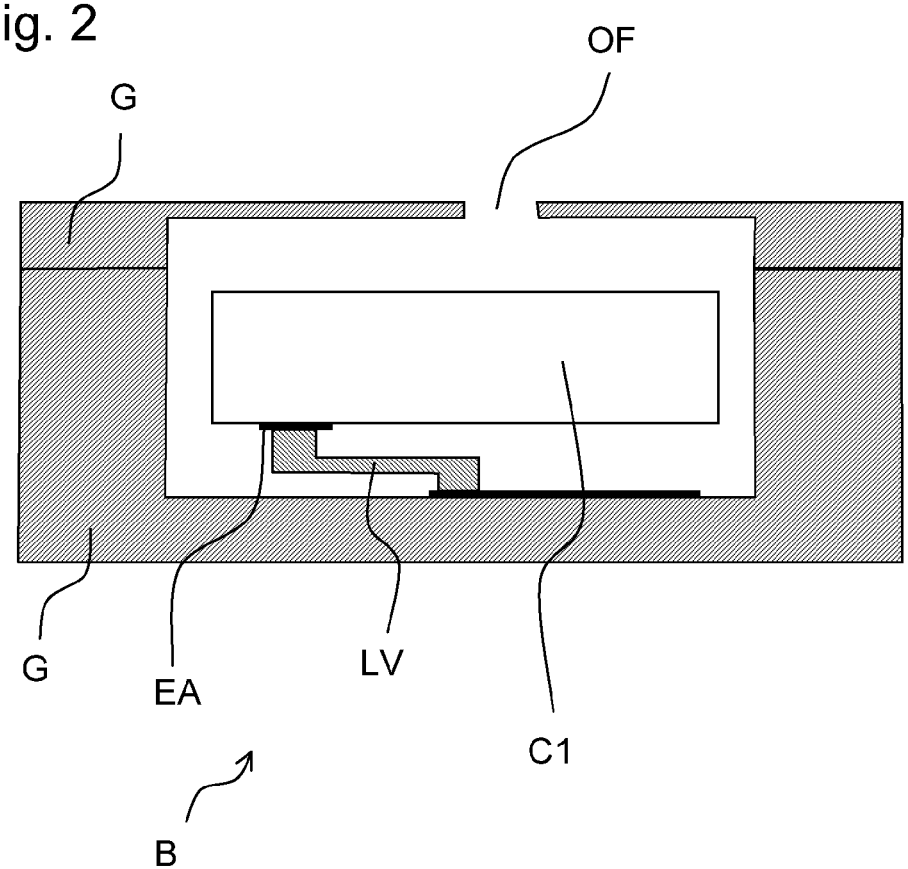
FIG. 2 shows a component having an opening in the housing.

FIG. 2 shows an embodiment of the component B wherein the housing G has a lower part and an upper part. Arranged in the upper part of the housing G is an opening OF, via which the chip C1 is in contact with the atmosphere surrounding the component.

Figure 3:
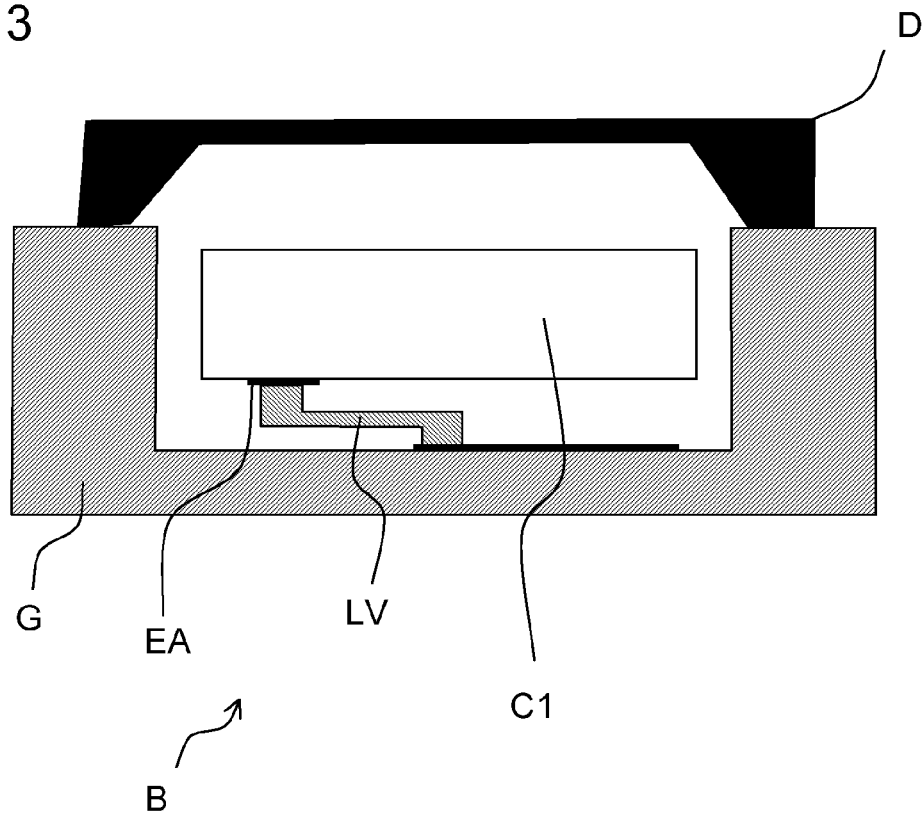
FIG. 3 shows a component having a cover.

FIG. 3 shows a component wherein the cavity of the housing G is covered by means of a cover D. The cover D has little or no transparency at all in the visible wavelength range. Consequently, the chip C1 arranged in the cavity is well protected against possibly harmful or undesirable incidence of light.

Figure 4:
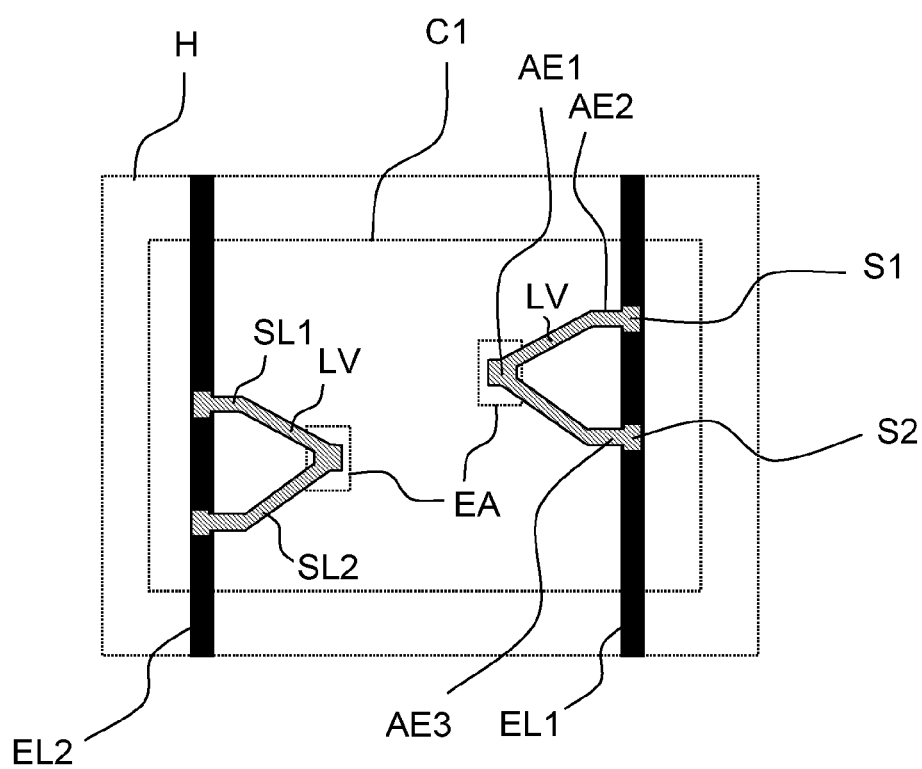
FIG. 4 shows a component comprising two flexible line connectors which are in each case attached to the inner side of the cavity at two locations spaced apart from one another.

FIG. 4 shows the arrangement of two mechanically flexible line connectors LV on the lower surface BFG of the cavity H.

A chip C1, identified by a rectangle drawn using dashed lines, is arranged in the cavity H. A first electrical line EL1 and a second electrical line EL2 are arranged on the lower surface or the bottom surface of the cavity. A respective one of the flexible line connectors LV is connected to and interconnected with a respective one of the electrical lines EL1, EL2 at two locations S1, S2. Each of the mechanically flexible line connectors LV comprises an electrical terminal EA embodied in areal fashion, via which the line connector is connected to and interconnected with an electrical terminal of the chip. The interconnection can be effected by means of bumps, for example.

The line connector has a first bearing element AE1, at which the electrical terminal EA of the chip is connected to the line connector. The line connector LV furthermore has at least two further second and third bearing elements AE2 and AE3 spaced apart from one another, at which the line connector is connected to the bottom surface BFG of the cavity of the housing body. The second and the third bearing element can be connected at two different locations, for example, to the electrical line EL1, EL2 arranged on the bottom surface of the housing cavity.

The line connector can have, in particular, at least two limbs SL1, SL2, wherein the two limbs are coupled to one another at a respective one of their end sections which form the first bearing element AE1. At the other end of each limb SL1, SL2, the two limbs are arranged in a manner spaced apart from one another. The second and the third bearing element AE2 and AE3 are arranged at the ends of the limbs which are spaced apart from one another. Consequently, each line connector is connected to and interconnected with one of the electrical lines EL1, EL2 at two different spatial locations S1, S2.

Figure 5:
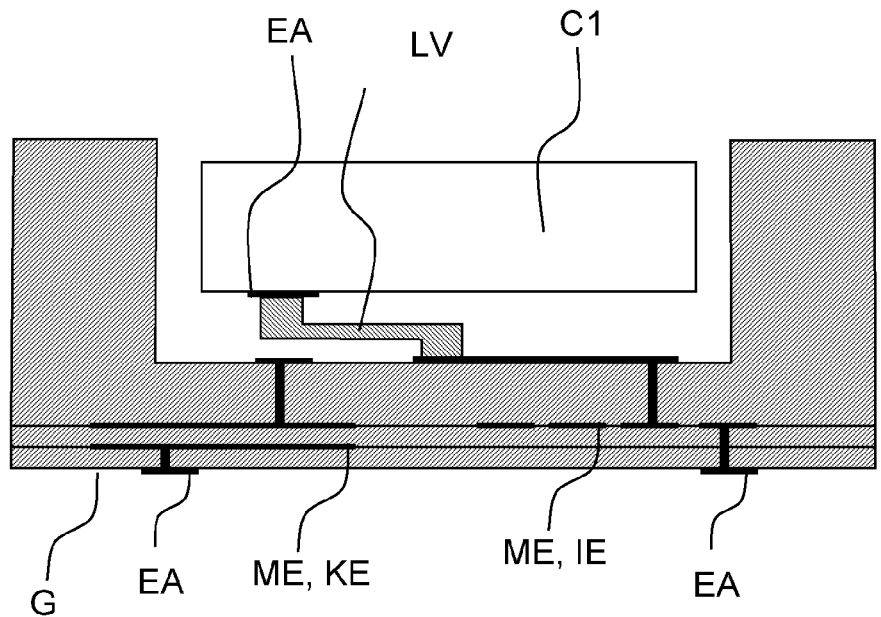
FIG. 5 shows a housing embodied in multilayered fashion.

FIG. 5 shows a housing G embodied in multilayered fashion. Metallization planes ME are arranged between the layers of the housing that are embodied in an electrically insulated fashion. Capacitive elements KE and inductive elements IE are patterned in the metallization planes ME. These impedance elements are interconnected with electrical terminals EA at the underside of the housing G via plated-through holes through the housing G or with electrical terminals at the underside of the chip C1 via electrical lines and the mechanical flexible line connector LV.

Figure 6:
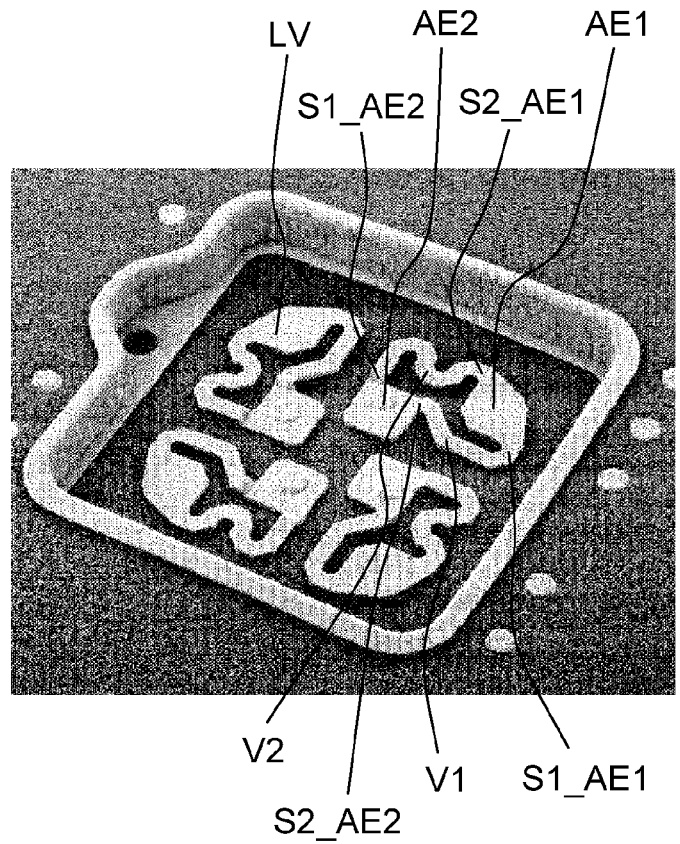
FIG. 6 shows a perspective view of the component.

FIG. 6 shows a perspective view of the cavity of a component according to the invention. In this case, no chip is arranged in the cavity, for the sake of better clarity. Four mechanically flexible line connectors LV are arranged on the underside of the cavity. Each of the mechanically flexible line connectors comprises a chip-supporting bearing element AE1 which is connected with a terminal pad EA of a chip, and a fixed bearing element AE2 which is connected to the bottom surface BFG of the housing in the cavity of the housing. At least two connecting webs V1, V2 are arranged between the chip-supporting bearing element AE1 and the fixed bearing element AE2. The connecting webs V1, V2 can be coupled to the bearing elements AE1, AE2 at different locations of the bearing elements. The connecting webs can be coupled to the bearing element AE1 at the different positions S1_AE1 and S2_AE2, and the connecting webs may be connected to the bearing element AE2 at the different locations S1_AE2 and S2_AE2.

For the purpose of improving the screening of light or electromagnetic interference, the walls of the cavity can be metallized.

Figure 7:
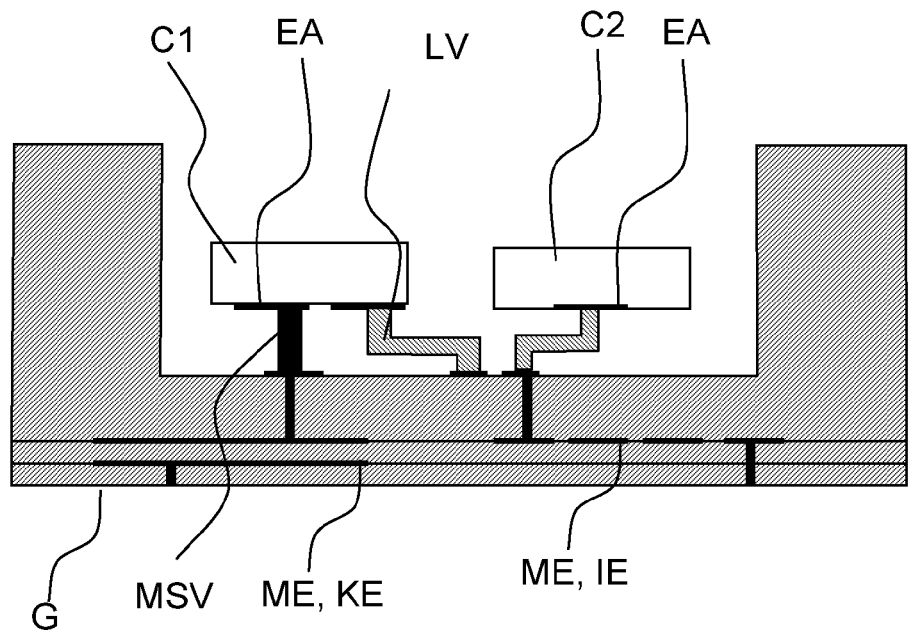
FIG. 7 shows a component comprising a first and a second chip.

FIG. 7 shows a configuration of the component wherein, alongside one chip C1, a second chip C2 is arranged in the cavity. Both chips are connected to and interconnected with the housing G by means of mechanically flexible line connectors LV. In addition, the first chip C1 is connected to and interconnected with the housing G by means of a mechanically stiff connection MSV. The chip C1 can be an acceleration sensor, for example. It can then be advantageous for the chip C1 to directly follow all the movements of the housing G. For this purpose, the mechanically stiff connection MSV transmits the acceleration forces experienced by the housing G directly on the first chip C1. The fact that the chip C1 is connected to the housing G by means of a mechanically flexible line connector LV alongside the mechanically stiff connection MSV effectively reduces the presence of stresses caused by different coefficients of thermal expansion.

It is possible for one of the chips not to be fixed with a flexible line connector, but rather in a conventional manner— e.g. by flip-chip connections or by means of an adhesive.

Figure 8:
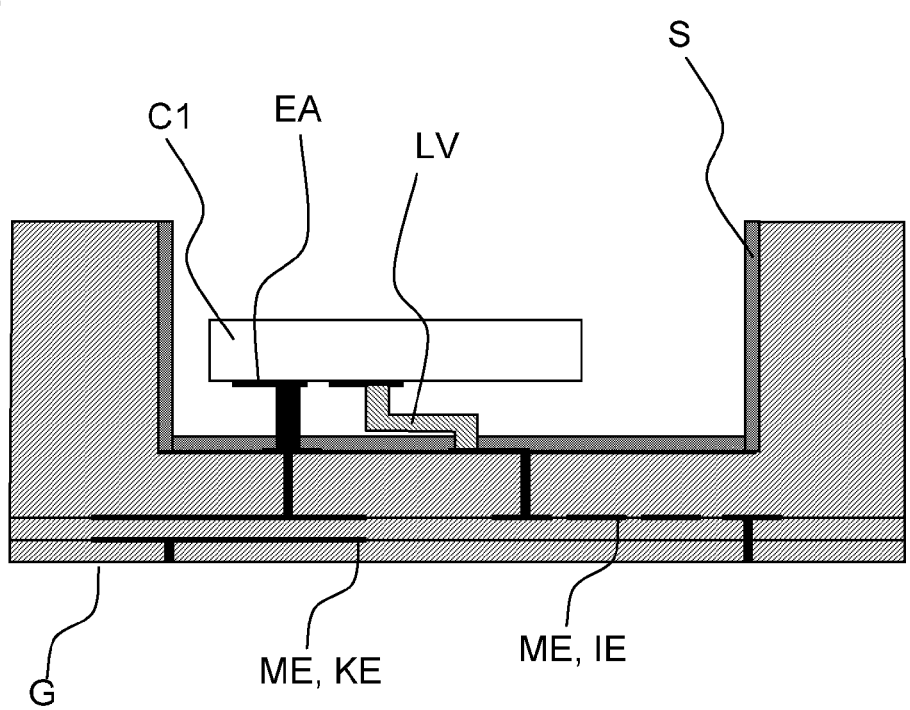
FIG. 8 shows a component comprising a protective film on the inner side of the cavity.

FIG. 8 shows a configuration of the invention wherein the surface of the cavity is covered with a protective layer S. The protective layer S covers only the inner side of the cavity, but not the surfaces of the line connectors and of the chip C1. The sensor functionality of the chip C1 is thus ensured. If a coating on the line connectors, the electrical lines and the chips is not disturbing, then it is also possible to cover their surfaces with a protective layer.

However, it is possible for all the inner surfaces to be covered. Selective covering which can be complicated in the production process, is not necessary in that case.

Figure 9:
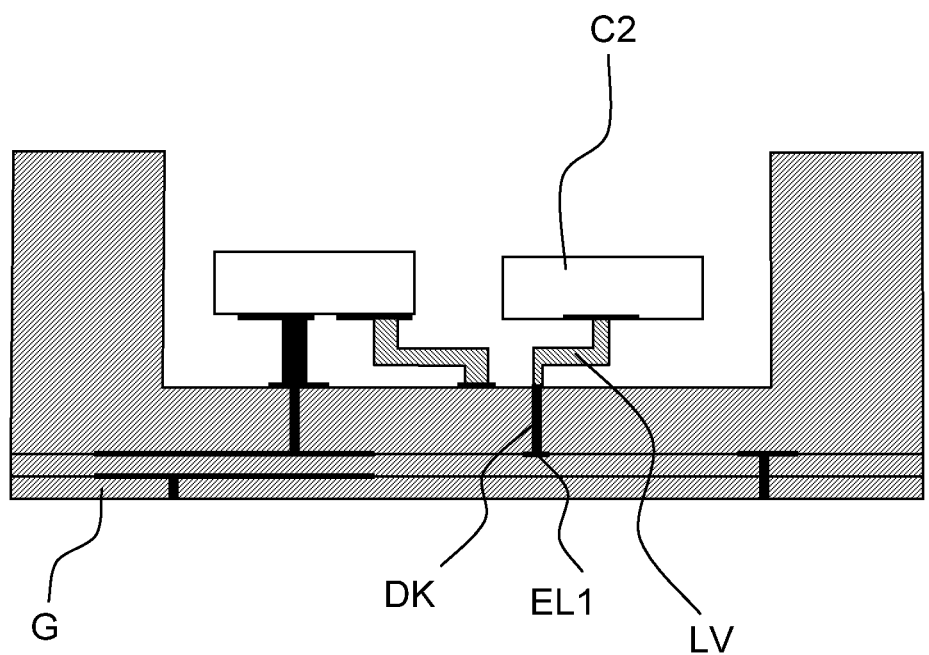
FIG. 9 shows a component comprising two chips and a flexible line connector, which is interconnected with an electrical line via a plated-through hole.

FIG. 9 shows a configuration of a component comprising two chips. One of the chips C2 is interconnected with an electrical line EL1 by means of a flexible line connector LV and via a plated-through hole DK. The electrical line EL1 is arranged in an inner layer of the housing G embodied in multilayered fashion. The point of connection of the flexible line connector to the housing is arranged directly above the plated-through hole. It is also possible for the flexible line connector to be embodied in a manner arranged perpendicularly and in rectilinear fashion.

In the case of the embodiments in FIGS. 1 to 9, the line connectors LV and the chip/chips C1, C2 can be arranged in such a way that all the side surfaces SFC of the chips are arranged in a manner spaced apart from the housing body and, in particular, are separated from the housing body by an air gap.

Components according to the invention are not restricted to the exemplary embodiments described. Variations comprising, for example, even further chips, line connectors, electrical lines or housing parts such as lower housing parts or covers, or any desired combinations thereof, likewise constitute exemplary embodiments according to the invention.

What is claimed is:
1. A component, comprising:
a chip having an electrical terminal;
a housing having a cavity, in which the chip is arranged, and an electrical line; and
a mechanically flexible line connector, which interconnects the electrical terminal of the chip with the electrical line, having a lower stiffness than the chip and being mechanically deformable, wherein the line connector has a first bearing element, at which the electrical terminal of the chip is connected to the line connector,
wherein
the line connector comprises at least a first connecting web and at least a second connecting web,
the first bearing element is coupled to the at least one first connecting web and the at least one second connecting web, the at least one first connecting web and the at least one second connecting web connect the first bearing element with the electrical line, the at least one first connecting web and the at least one second connecting web are arranged spaced apart from each other between the first bearing element and the electrical line, and the inner side of the cavity and the surfaces of the chip and of the line connector are covered with a polymer film having a thickness less than or equal to 10 μm.

2. The component according to claim 1, wherein the line connector has at least a second bearing element and a third bearing element spaced apart therefrom, at which the line connector is attached to the inner side of the cavity.

3. The component according to claim 1, wherein the line connector has at least a second bearing element, wherein the at least one first and second connecting webs are arranged between the first bearing element and the second bearing element, wherein the at least one first connecting web and the at least one second connecting web are connected to the first bearing element at different locations of the first bearing element.

4. The component according to claim 3, wherein the at least one first connecting web and the at least one second connecting web are connected to the second bearing element at different locations of the second bearing element.

5. A component, comprising:

a chip having a plurality of side surfaces and having an electrical terminal;

a housing having a cavity, in which the chip is arranged, and an electrical line; and a mechanically flexible line connector, which interconnects the electrical terminal of the chip with the electrical line, has a lower stiffness than the chip and is mechanically deformable, wherein the housing has an opening, through which the cavity is in contact with the atmosphere surrounding the component, the chip is a sensor, and wherein an inner side of the cavity and the surfaces of the chip and of the line connector are covered with a polymer film having a thickness less than or equal to 10 μm.

6. The component according to claim 5, wherein the chip is a pressure sensor, a sound sensor, an optical sensor or a sensor for detecting a gas composition.

7. The component according to claim 5, wherein the diameter of the opening is less than or equal to 100 μm.

8. The component according to claim 1, wherein the housing comprises ceramic, a high temperature cofired ceramic (HTCC), or a low temperature cofired ceramic (LTCC).

9. The component according to claim 1, wherein:

the housing comprises a multilayered HTCC or a multilayered LTCC, metallization planes are arranged between the layers, and the metallization planes overlap the base area of the cavity in total to the extent of at least 80% of the base area of the cavity.

10. The component according to claim 1, wherein the cavity is covered with a metallization layer on the inside.

11. The component according to claim 1, wherein:

the chip is operated at an electrical, mechanical or acoustic operating frequency, and the natural frequency of the mechanical oscillator consisting of the chip and the mechanically flexible line connectors is less than 0.8 times the operating frequency of the chip.

12. The component according to claim 1, wherein a further chip and a further electrical line are additionally arranged in the cavity and the further chip is interconnected with the electrical line or the further electrical line.

13. The component according to claim 1, wherein an application-specific integrated circuit (ASIC) chip or a microelectromechanical system (MEMS) chip is interconnected as the chip.

14. The component of claim 1, where the cavity is covered with a cover.

15. A component, comprising:

a chip having an electrical terminal;

a housing having a cavity, in which the chip is arranged, and an electrical line; and a mechanically flexible line connector, which interconnects the electrical terminal of the chip with the electrical line, having a lower stiffness than the chip and being mechanically deformable, wherein the line connector has a first bearing element, at which the electrical terminal of the chip is connected to the line connector, wherein the line connector comprises at least a first connecting web and at least a second connecting web, the first bearing element is coupled to the at least one first connecting web and the at least one second connecting web, the at least one first connecting web and the at least one second connecting web connect the first bearing element with the electrical line, the at least one first connecting web and the at least one second connecting web are arranged spaced apart from each other between the first bearing element and the electrical line, the chip is operated at an electrical, mechanical or acoustic operating frequency, and the natural frequency of the mechanical oscillator consisting of the chip and the mechanically flexible line connectors is less than 0.8 times the operating frequency of the chip.

16. The component of claim 15, where the cavity is covered with a cover.

17. A component, comprising:

a chip having an electrical terminal;

a housing having a cavity and an electrical line, wherein the chip is arranged in the cavity;

a mechanically flexible line connector, which interconnects the electrical terminal of the chip with the electrical line, has a lower stiffness than the chip and is mechanically deformable; and a light-transparent polymer layer covering the chip and having a thickness less than or equal to 10 μm and an optical absorptance greater than 95% in the wavelength range of between 400 nm and 1100 nm.

18. The component according to claim 17, wherein:

the housing comprises a multilayered HTCC or a multilayered LTCC, metallization planes are arranged between the layers, and the metallization planes overlap the base area of the cavity in total to the extent of at least 80% of the base area of the cavity.

19. The component according to claim 17, wherein the cavity is covered with a metallization layer on the inside.

20. The component according to claim 17, wherein:
the chip is operated at an electrical, mechanical or acoustic operating frequency, and
the natural frequency of the mechanical oscillator consisting of the chip and the mechanically flexible line connectors is less than 0.8 times the operating frequency of the chip.

21. The component according to claim 17, wherein a further chip and a further electrical line are additionally arranged in the cavity and the further chip is interconnected with the electrical line or the further electrical line.

22. The component of claim 17, wherein an inner side of the cavity and the surfaces of the chip and of the line connector are covered with a polymer film having a thickness less than or equal to 10µm.

23. The component of claim 17, wherein the polymer layer is a polymer film that covers an inner side of the cavity and the surfaces of the chip and of the line connector.

* * * * *